United States Patent [19]
Morimoto et al.

[11] Patent Number: 5,168,306
[45] Date of Patent: Dec. 1, 1992

[54] EXPOSURE APPARATUS

[75] Inventors: Akira Morimoto, Tokyo; Satoru Tachihara, Shiki; Yuji Matsui, Kawagoe, all of Japan

[73] Assignee: Asahi Kogaku Kogyo Kabushiki Kaisha, Tokyo, Japan

[21] Appl. No.: 863,538

[22] Filed: Apr. 6, 1992

Related U.S. Application Data

[63] Continuation of Ser. No. 759,770, Sep. 13, 1991, abandoned, which is a continuation of Ser. No. 504,621, Apr. 4, 1990, abandoned.

[30] Foreign Application Priority Data

Apr. 4, 1989 [JP] Japan .................. 1-85247

[51] Int. Cl.$^5$ .......................................... G03B 27/42
[52] U.S. Cl. ............................................ 355/53; 355/41
[58] Field of Search .......................... 355/43, 51, 61; 250/491.1; 356/401

[56] References Cited

U.S. PATENT DOCUMENTS

| | | | |
|---|---|---|---|
| 3,494,697 | 2/1970 | Nygaard | 355/53 |
| 3,712,740 | 1/1973 | Hennings | 356/152 |
| 4,367,046 | 1/1983 | Lacombat | 355/53 X |
| 4,662,754 | 5/1987 | Mayer | 355/53 X |
| 4,711,567 | 12/1987 | Tanimoto | 355/53 |
| 4,794,426 | 12/1988 | Nishi | 355/53 X |
| 4,822,975 | 4/1989 | Torigoe | 355/53 X |
| 4,855,792 | 8/1989 | Holbrook et al. | 355/53 |
| 4,931,830 | 6/1990 | Suwa et al. | 355/53 X |
| 4,952,970 | 8/1990 | Suzuki et al. | 355/43 |
| 4,967,088 | 10/1990 | Stengl et al. | 250/491.1 |
| 5,026,145 | 6/1991 | Marui et al. | 350/351 |

FOREIGN PATENT DOCUMENTS

64-81928 3/1989 Japan .

Primary Examiner—Richard A. Wintercorn
Attorney, Agent, or Firm—Sandler, Greenblum & Bernstein

[57] ABSTRACT

An exposure apparatus where a mask table having an exposing pattern and a work to be exposed are relative to each other movable, wherein the moving amount of the mask table is detected by a scale image formed through a projection lens system, so that even if the projection lens system has a magnification error, by optically offsetting it, the moving amount of the mask table can be detected. Thus, a more accurate control can be obtained so that a mask image can be more precisely reproduced on a work.

37 Claims, 7 Drawing Sheets

EXPOSURE APPARATUS

This application is a continuation of application Ser. No. 07/759,770, filed Sept. 13, 1991, now abandoned; which is a continuation of application Ser. No. 07/504,621, filed Apr. 4, 1990, now abandoned.

BACKGROUND OF THE INVENTION

The present invention relates to an exposure apparatus for forming a pattern image corresponding to at least a part of a desired image on a work to be exposed; and for relatively moving a work table for mounting the work and a mask table on which the pattern is provided in a optical projection system so as to entirely expose the pattern image on the work. More particularly, the present invention is directed to an exposure unit that is capable of detecting the amount of moving of the mask table and accurately executing an exposure operation even if the projection optical system has a magnification error.

In a conventional exposure apparatus, employed in a copy machine, so-called steppers and so forth, are constituted in such a manner that a mask table and a work table are moved relative to each other. It is necessary to control the mask table and the work table so as to be moved with a predetermined relationship with each other in accordance with a magnification of a projecting lens system provided between the mask and the work. In other words, it is necessary to synchronously move the mask table and the work table with each other. To synchronously move the mask table in such an exposure apparatus and the work table, it is necessary to provide some link members for determining the moving amount of one table according to that of the other table, as well as independent feed back systems therefore, and it may be considered that a structure of the exposure apparatus is arranged in such a manner that the moving amount of the mask table is detected on the mask table side; the link members being controlled in accordance with a result of the detection operation; the link members determining the moving amount of the work table by multiplying the moving amount by a predetermined value corresponding to the magnification of the optical system.

However, in the above described structure, because the magnification of the optical system becomes a fixed coefficient, even if there is an error in the magnification, the moving amount is controlled according to the designed magnification including the error. Thus, if there is an error in the magnification of the projecting lens system, the pattern, corresponding to an image on the mask, formed on the work may deflect from the mask pattern based upon the error.

SUMMARY OF THE INVENTION

It is therefore an object of the invention to provide an improved exposure apparatus that is capable of precisely projecting a pattern of a mask on a work even if there is an error in the magnification of an optical projection system.

For this purpose, according to the invention, there is provided an exposure apparatus comprising:

a projecting lens system for focusing an optical image corresponding to a part of the original image on an object to be exposed to light;

first means for driving the original image and the projecting lens system with respect to each other;

second means for driving the object to be exposed to light and the projecting lens system with respect to each other;

a projecting scale member, arranged to be movable with the original, for forming a scale image through the projecting lens system in accordance with a shape of the projecting scale member on an object side of the projecting lens system;

light receiving means for receiving the scale image moved by the said first drive means and outputting a predetermined signal based upon the movement of the scale image; and linking means for controlling the object so as to be synchronously moved with the said movement of the scale image based upon the predetermined signal outputted from the light receiving means.

DESCRIPTION OF THE EMBODIMENT

Referring to the drawings, an embodiment of the present invention will be described hereinafter.

Figure 1:
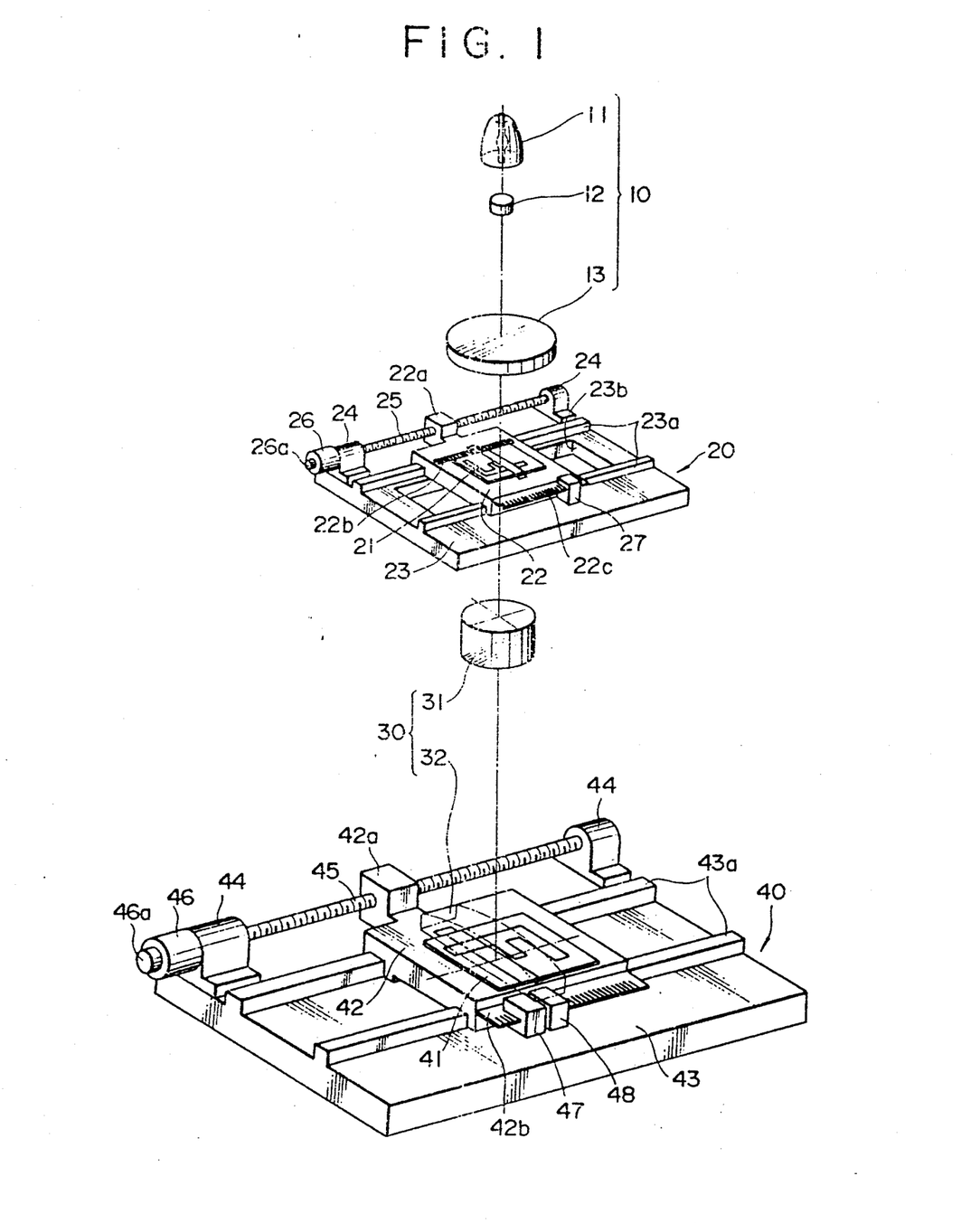
FIG. 1 is a descriptive schematic of an optical system showing one embodiment of the exposure apparatus according to the present invention.

As illustrated in FIG. 1, an exposure apparatus according to the present invention comprises a light source section 10, including a light source 11 for radiating light having a predetermined wavelength; for example, a mercury vapor lamp, a mask section 20 having a liquid crystal light valve 21 as a mask on which a pattern image has been drawn, a projection lens system 30 for projecting the pattern image on the mask by a light penetrated through the liquid crystal light valve 21, and a work 41, on which an image corresponding to the pattern, such as a printed circuit board (PCB) is placed.

In the light source section 10, an integrator 12 equalizes the light intensity of the light radiated from the mercury vapor lamp 11, and a condenser lens 13 focuses the light and projects the light onto the liquid crystal light valve 21.

The pattern image is formed on the liquid crystal light valve 27 by a well-known optical write system, not shown, the liquid crystal light valve 21 being disposed on a mask table 22. The mask table 22 slidably engages a pair of guide rails 23a, 23a provided on a mask base 23 which are parallel with each other.

At a center portion on the mask base 23 is an opening 23b for penetrating light from the liquid crystal light valve 21 to a work section 40.

A feed screw 25 disposed between a pair of bearings 24 and 24 which are disposed at both ends of the mask base 23. The feed screw 25 is disposed in parallel with the guide rails 23a, 23a. The mask table 22 is provided with a feed nut 22a that engages feed screw 25. The feed screw 25 is rotatably driven by a servo motor 26 so that the mask table 22 slides along the pair of guide rails 23a, 23a.

The servo motor 26 is provided with a speed detector 26a for detecting the speed of the rotating shaft. stripe shaped projection scale 22b whose light transmittance is arranged to be varied along a sliding direction of the mask table 22 is disposed adjacent to the liquid crystal light valve 21 at a predetermined part on the mask table 22. Accordingly, the light penetrated through the projection scale 22b forms a stripe shaped pattern image on the work section 40.

A first linear scale 22c having a stripe shaped pattern whose light transmittance is arranged to be varied along the sliding direction of the mask table 22 is provided on the side of the mask table 22. Further, a first linear head 27 is provided on the mask base 23. The first linear head 27 is provided with a light transmitting section and a light receiving section which are opposed with the first linear scale 22c therebetween. The first linear scale 22c is arranged to be movable between the light receiving section and the light transmitting section of the first linear head 27. The first linear head 27 outputs a pulse train according to the moving amount of the first linear scale 22c as the first linear scale 22c moves.

A so-called telecentric optical system is used to allow a precise pattern to be formed even when the flatness of the work is low or when the projection optical system is defocused.

However, by utilizing the telecentric optical system, it becomes necessary for a lens on the work side of the optical system to entirely cover the work. Thus, if the size of the work becomes large, it becomes difficult to produce the lens at a low cost.

To solve the above problem, a projection lens system 30 in this embodiment comprises a first lens group 31 which is rotational-symmetrical cylindrical and a second lens group 32 in a shape where a part, including the diameter of a circular lens, is cut in a plane rectangular shape, the projection lens system 30 being a system telecentric to the image side. The projection lens system 30 focuses light from the light source section 10 through both the liquid crystal light bulb 21 and the opening 23b onto the work 41 in a slit shape.

The work section 40 is provided with a work table 42 on which the work 41 is placed and a work base 43 for mounting the work table 42. The work table 42 slidably engages a pair of guide rails 43a, 43a which are disposed in parallel on the work base 43.

A feed screw 45 is disposed between a pair of bearings 44, 44 which are disposed at both ends of the work base 43. The feed screw 45 is parallel with the pair of guide rails 43a, 43a. The work table 42 is provided with a feed nut 42a which engages with the feed screw 45. The feed screw 45 is rotatably driven by a servo motor 46 so that the work table 42 slides along the pair of guide rails 43a, 43a. The servo motor 46 is provided with a speed detector 46a for detecting the speed of the rotating shaft.

A second linear scale 42b having a stripe shaped pattern whose light is arranged to be varied along the sliding direction of the work table 42 is provided on the side of the work table 42. A second linear head 47 is also provided. The second linear head 47 is provided with a light transmitting section and a light receiving section which are opposed with the second linear scale 42b therebetween. The second linear scale 42b is arranged to be movable between the light transmitting section and the light receiving section of the second linear head 47. The second linear head 47 outputs a pulse train according to the moving amount of the second linear scale 42b as the second linear scale 42b moves.

A third linear head 48 acting as a light receiving unit for receiving light passed through the projection lens system 30 is provided below the second lens group 32 adjacent to the second linear scale 47. Thus, an image of the projection scale 22b which moves according to a movement of the mask table 22 is formed on the third linear head 48 and a pulse train according to the moving amount of the mask table 22 is outputted.

Figure 2:
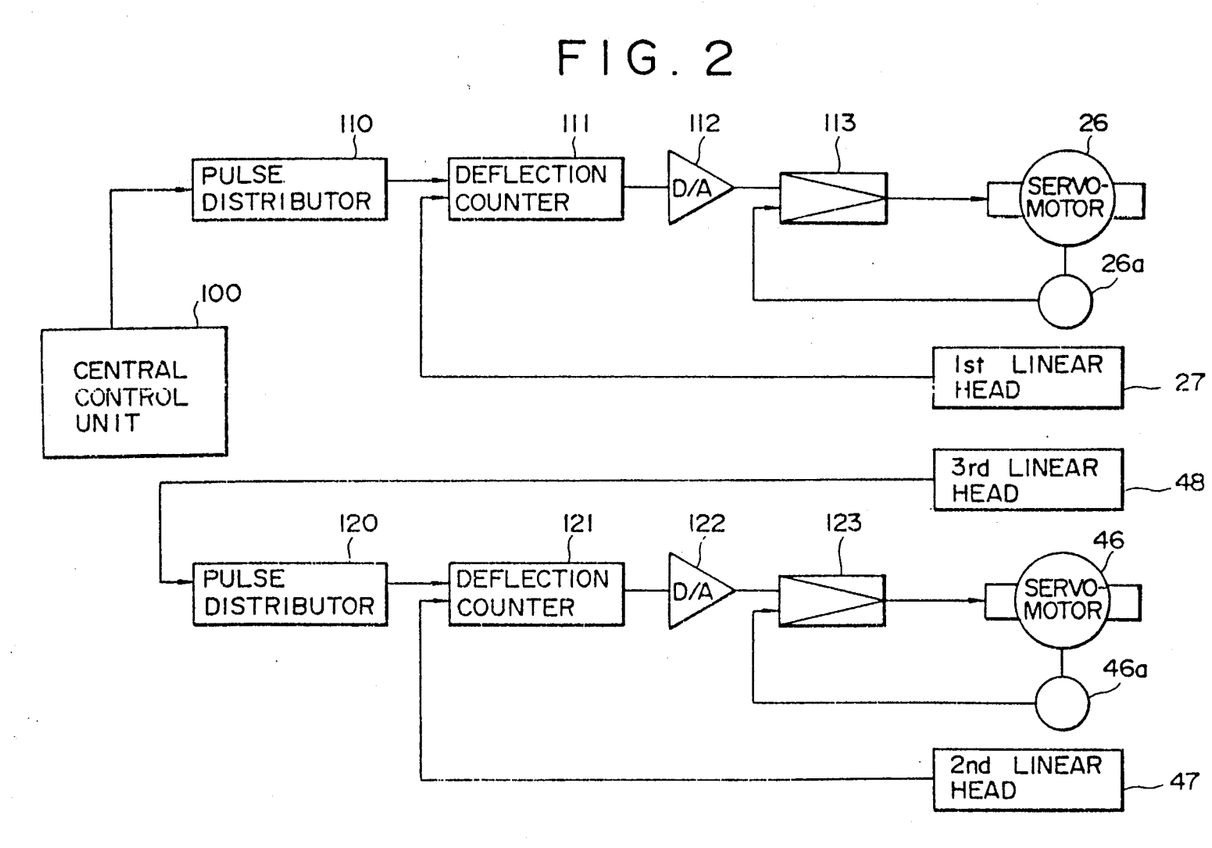
FIG. 2 is a block schematic of a control system of the apparatus shown in FIG. 1.

FIG. 2 shows the control system of the apparatus described above. The exposure apparatus according to the present invention comprises, as illustrated in FIG. 2, a central control unit 100 for controlling the entire apparatus, i.e. a system for controlling the movement of the mask table 22.

The mask side system comprises a pulse distributor 110 for primarily determining the moving amount of the mask table 22, a deflection counter 111 for detecting a deflection between the pulse train based upon the determined moving amount and a pulse train based upon an actual moving, output from the first linear head 27 and for compensating it, a D/A (Digital/Analog) converter 112 for converting the output of the deflection counter 111 into analog data, and a servo amplifier 113 for supplying a drive current to the servo motor 26 based upon the output signal from the D/A converter 112 and the output signal from the speed detector 26a. In other words, the moving amount of the mask table 22, i.e., the drive current for driving the mask table 22 is determined in accordance with a feed back operation from the speed detector 26a.

On the other hand, the work side system comprises another pulse distributor 120 for detecting the moving amount of the mask table 22 based upon the output signal from the third linear head 48, the detected movement including a movement based upon a magnification error that occurs along an optical pass from the light source section 10 to the projection lens system 30, and for further determining the moving amount of the work table 42 in accordance with the detected moving amount, another deflection counter 121 for detecting a deflection between the pulse train based upon the determined moving amount and a pulse train based upon an actual moving output from the second linear head 47, another D/A converter 122, and a servo amplifier 123 for supplying a drive current to the servo motor 46 according to the output of the speed detector 46a.

In the structure described above, the mask table 22 is moved at a predetermined speed by a command issued from the central control unit 100.

On the other hand, the work table 42 is moved according to the moving amount of the work table 42 including the magnification error of the projection lens system 30.

Figure 3:
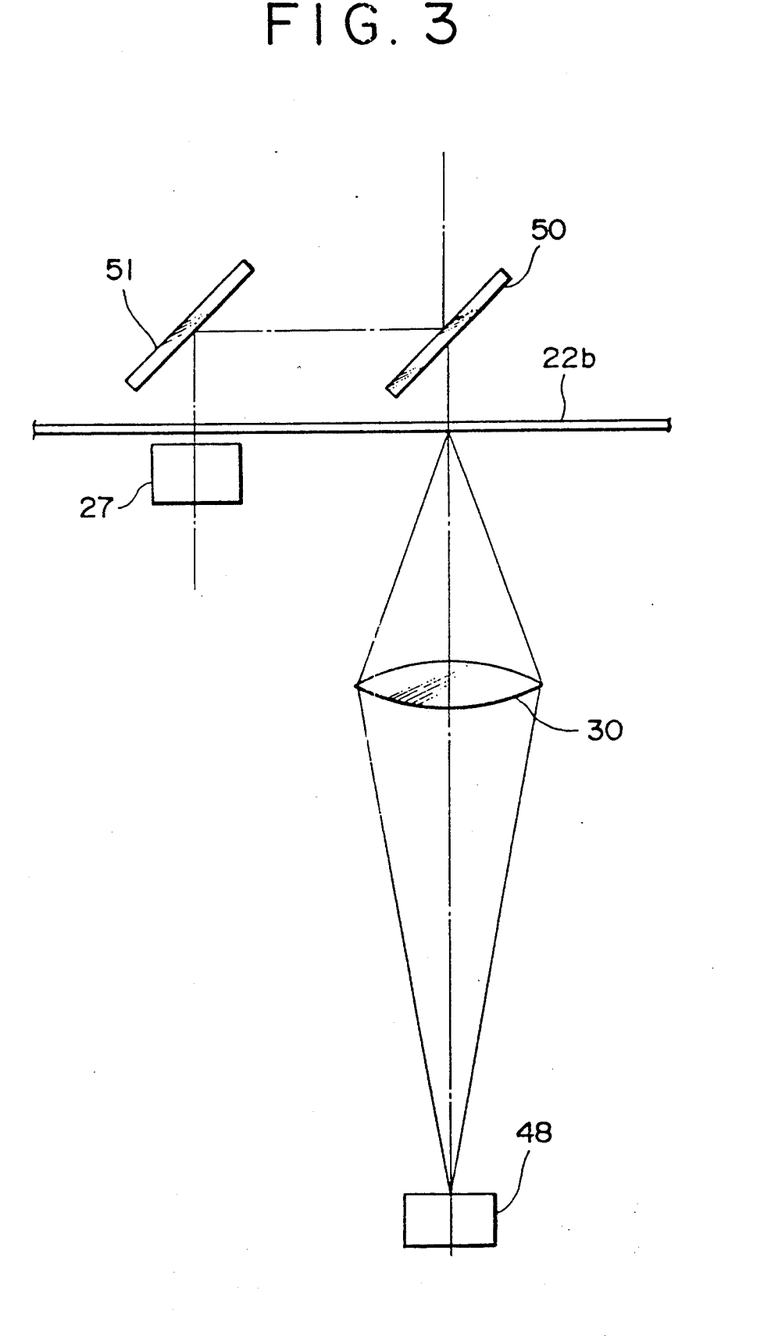
FIG. 3 is a descriptive schematic of an optical system showing a modified example of the exposure apparatus shown in FIG. 1.

In addition, in the above embodiment, the projection scale 22b and the first linear scale 22c are independently provided. However, as illustrated in FIG. 3, they can be used in common. In other words, the light from the light source section 10 is divided by a half mirror 50. The reflected component at the half mirror 50 is further reflected by a mirror 51 and received by the first linear head 27 through the projection scale 22b. The penetrated component at the half mirror 50 is received by the third linear head 48 through the projection scale 22b and the projection lens system 30.

It is possible to use a light receiving element such as a photo-diode, as the light receiving section in the third linear head 48. Further, it is possible to constitute, as illustrated in FIG. 4, the third linear head 48 in such a manner that a plurality of light receiving elements 48a through 48d and a scanning plate 48e are provided, each of the elements respectively corresponding to the phases of one pitch of the projected scale image at 90°, 180°, 270°, 360°.

Figure 4:
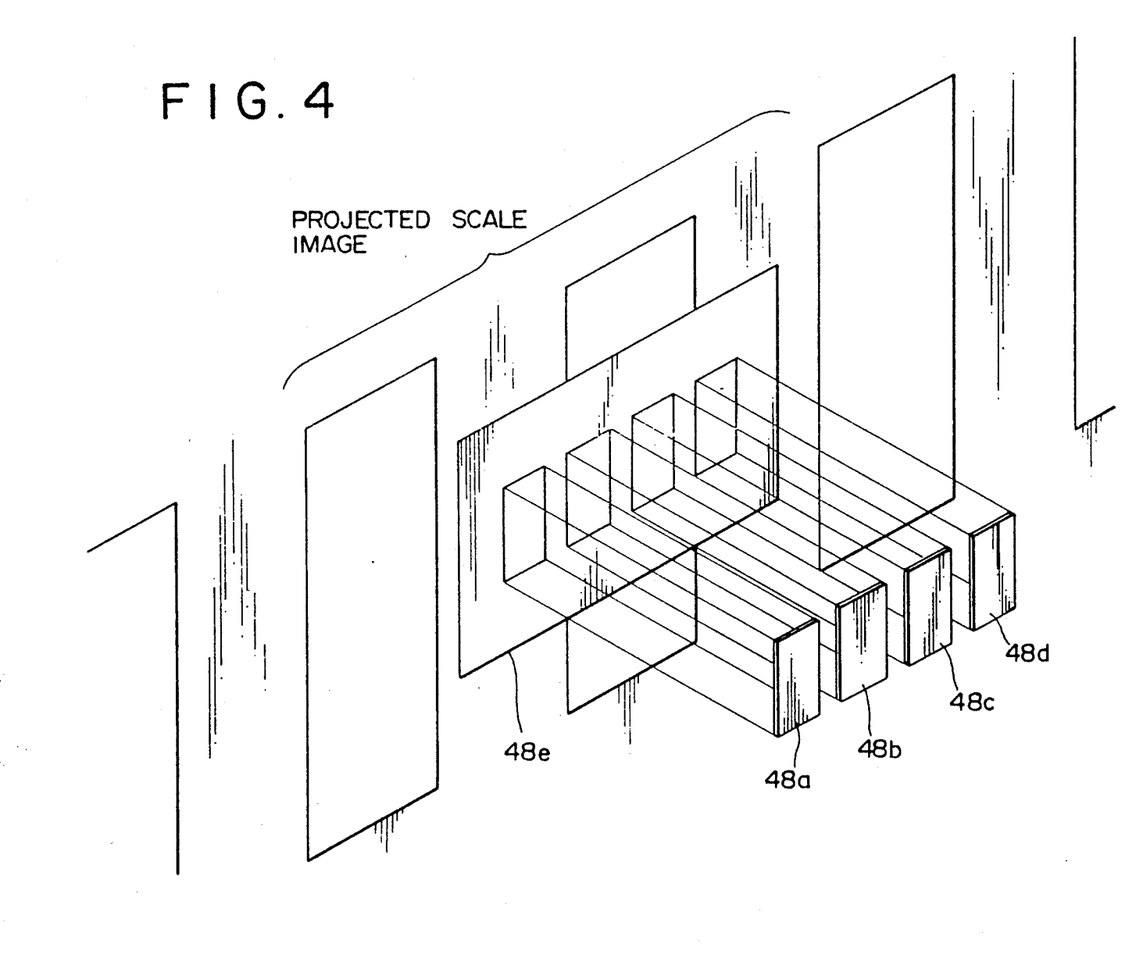
FIG. 4 is a detail view of a linear head employed with the exposure apparatus shown in FIG. 1.
Figure 5:
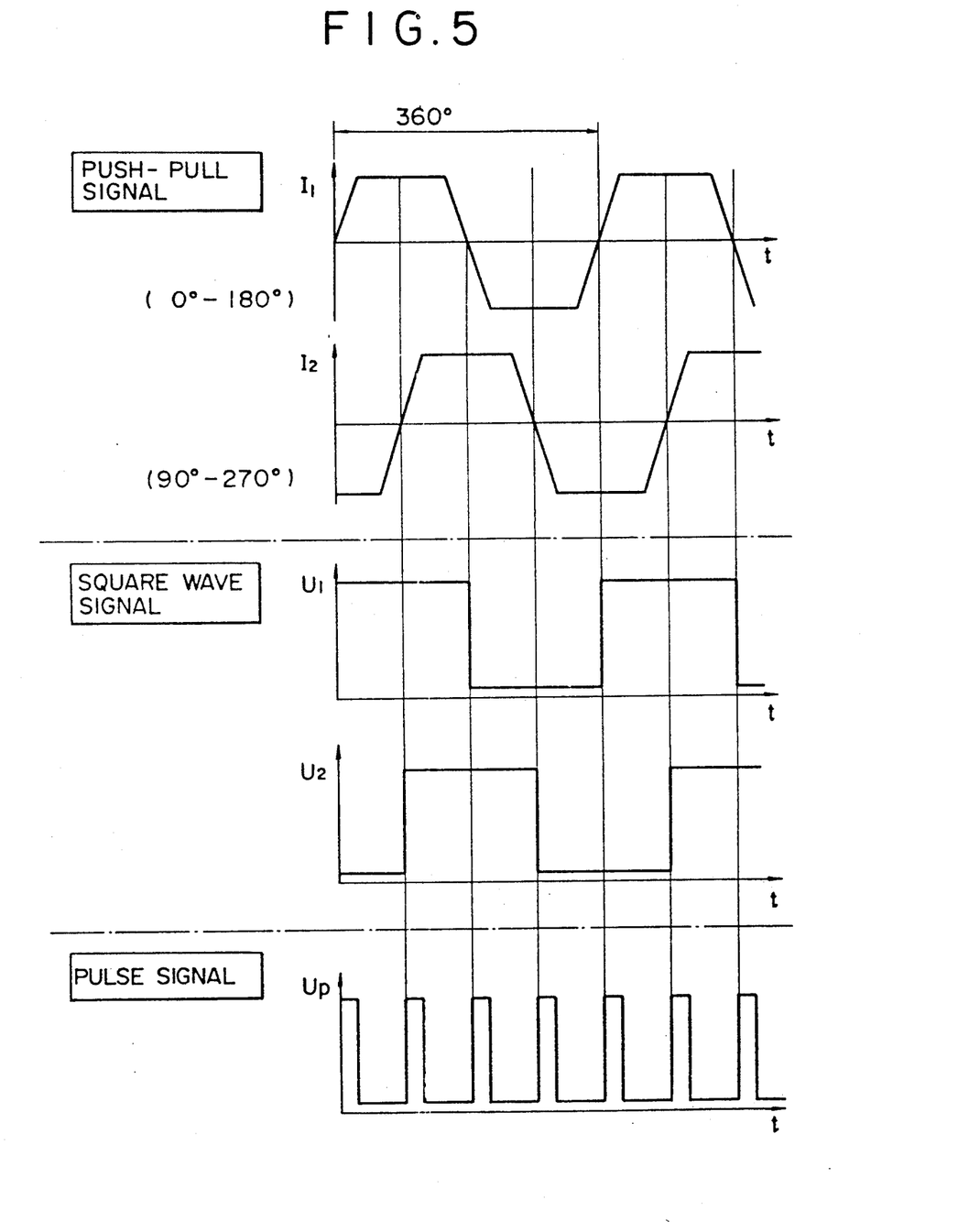
FIG. 5 is a graph showing output signals outputted from the linear head of FIG. 4.

A control method using the above configuration, illustrated in FIG. 4, is described below, referring to a drawing illustrated in FIG. 5.

Two push-pull signals I1, I2, spaced apart from each other by 90°, are obtained by respectively connecting output signals from light receiving elements 48a and 48c, 48b and 48d of the third linear head 48 in a push-pull fashion. The signals I1, I2 are analog signals, which are respectively converted to digital signals U1, U2, having a square wave formed by passing then through a predetermined wave conversion circuit, not shown.

Further, a pulse signal Up is obtained, by detecting the leading or trailing edges of the digital signals U1, U2, whose frequency is quadruple, comparing it with that of the digital signal U1, or U2. The work table 42 is driven to be moved in accordance with the obtained pulse signal Up. As described above, by providing a plurality of light receiving elements, the accuracy of a moving amount is improved.

Figure 6:
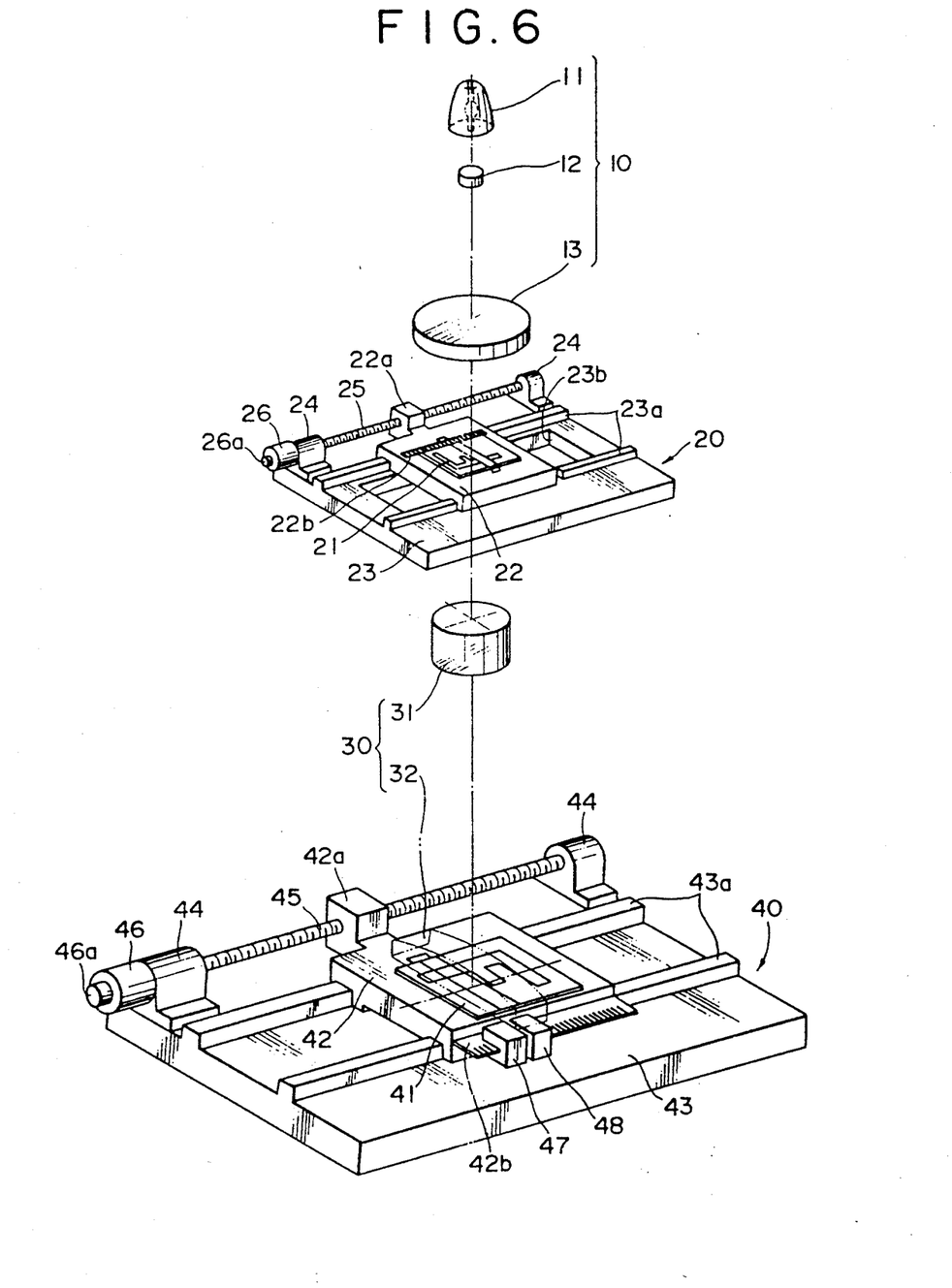
FIG. 6 is a descriptive schematic of an optical system showing another embodiment of the exposure apparatus according to the present invention.
Figure 7:
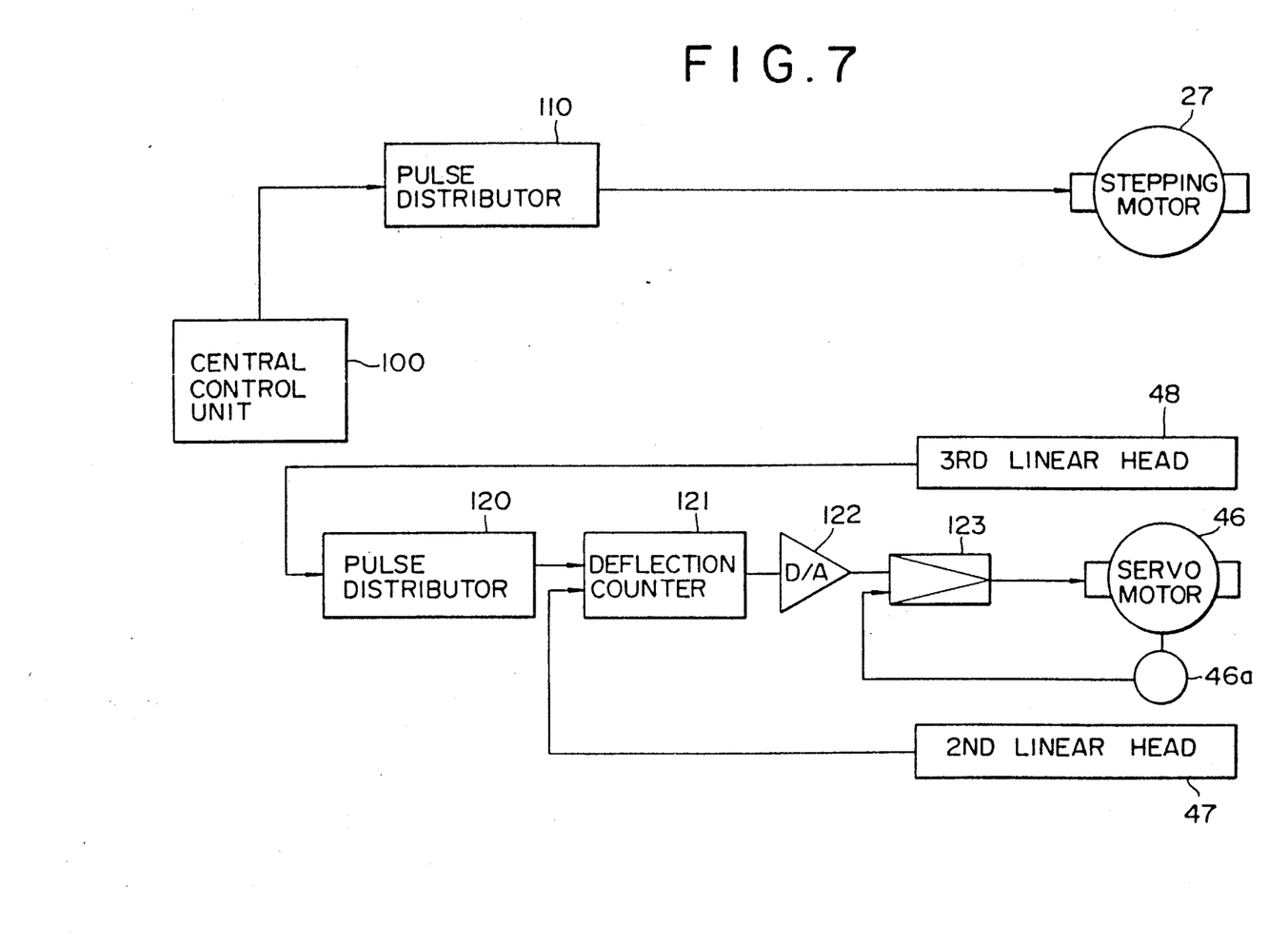
FIG. 7 is a block schematic of a control system of the apparatus shown in FIG. 6.

Referring to FIG. 6 and 7, another embodiment according to the present invention is described.

In this embodiment, the mask table is controlled to be moved in an open loop, i.e., it is not controlled using a feed-back signal. This embodiment is employed in a device in which it is unnecessary to finely form an image corresponding to the pattern or in which a material, whose photo-sensitivity is sharp, such as a lith film, is used as an object on which an image is formed. In such type devices, it is not necessary to accurately control the movement of the mask table 22. In this embodiment, as illustrated in FIG. 6, a linear scale is provided for detecting an amount of the mask table. A speed detector is provided for detecting a speed of a motor by which the mask table is driven to be moved, and the mask table is driven to be moved by a stepping motor. The stepping motor 27 is, as illustrated in FIG. 7, controlled by a pulse train from the pulse distributor 110. The pulse distributor 110 is controlled by the central control unit 100.

As described above, in an exposure apparatus according to the present invention, it is possible to move both the mask table, on which a mask including a pattern image is provided, and the work table, on which a material is to be exposed and in accordance with the pattern image so that the material on the work table is accurately exposed to light in accordance with the pattern image, since the exposure apparatus is arranged that the moving amount of the mask table is detected by a scale image formed through a projection lens system and the work table is controlled by the scale image. In other words, the mask table and the work table are optically linked with each other so that it becomes possible to form a high accuracy image on the material located on the work table in accordance with the pattern image that is formed on the mask table, even when the mask table is moved, or when the projection lens system has a so-called magnification error. Further, it may be considered that the exposure apparatus according to the present invention is adapted to a device in which an image is formed by means of a reflected light, such as a copying machine, and that a drum shaped material is employed as an object on which an image is formed instead of a plate shaped work employed in the above embodiments.

What is claimed is:

1. An exposure apparatus comprising:
   a projecting lens system for focusing an optical image corresponding to a part of an original image on an object to be exposed to light;
   first means for driving said original image and said projecting lens system to be moved relative to each other;
   second means for driving said object to be exposed to light and said projecting lens system to be moved relative to each other;
   a projecting scale member, arranged to be movable with said original image, for forming a scale image in accordance with a shape of said projecting scale member on an object side of said projecting lens system;
   light receiving means for receiving said scale image moved by said first drive means and outputting a predetermined signal based upon the movement of said scale image; and
   optical linking means for controlling said object so as to be synchronously moved with said movement of said scale image based upon said predetermined signal outputted from said light receiving means.

2. The exposure apparatus according to claim 1, wherein said light receiving means comprises a linear head member for receiving said scale image scale member.

3. The exposure apparatus according to claim 2, wherein said linear head member includes a plurality of light receiving elements, arranged along a moving direction of said object, for respectively receiving said scale image, whereby pitches of said scale image are received by said light receiving elements in a predetermined phase interval determined by the number of said light receiving elements.

4. The exposure apparatus according to claim 3, wherein said number of light receiving elements is four.

5. The exposure apparatus according to claim 1, which further comprises means for controlling said original image to move said original image by a predetermined amount and at a predetermined rate of speed.

6. The exposure apparatus according to claim 5, wherein said controlling means comprises a linear head member for measuring the movement of said original image.

7. A movement control system, adapted to be positioned in a device having a plurality of moving objects which are driven to be moved, for controlling each of said moving objects so as to be moved with a predetermined relationship, said movement control system comprising:
   means for projecting an optical reference image corresponding to a reference image formed on a predetermined one of said plurality of moving objects, said reference image relating to a movement of said predetermined one of said plurality of moving objects;
   means for receiving said optical reference image projected from said predetermined one of said plurality of moving objects, said receiving means being provided on each of said plurality of moving objects other than said predetermined one of said plurality of moving objects; and means for controlling said plurality of moving objects other than said predetermined one of said plurality of moving objects so as to be synchronously moved with said movement of said reference image, based upon said optical reference image received by said receiving means.

8. The movement controlling system according to claim 7, wherein the number of said plurality of moving objects included in said device it two.

9. An exposure apparatus, comprising:

a projecting lens system for focusing an optical image corresponding to a part of an original image on an object to be exposed to light;

first means for driving said original image and said projecting lens system to be moved relative to each other;

second means for driving said object to be exposed to light and said projecting lens system to be moved relative to each other;

a predetermined projecting pattern that is arranged to be movable with said original image for forming a pattern image through said projecting lens system in accordance with a shape of said predetermined projecting pattern on an object side of said projecting lens system;

means for receiving said pattern image moved by said first drive means and outputting a predetermined signal based upon the movement of said pattern image; and means for controlling said object so as to be synchronously moved with said movement of said pattern image based upon said predetermined signal outputted from said receiving means.

10. The exposure apparatus of claim 9, wherein said predetermined projecting pattern is provided within a predetermined scale member.

11. The exposure apparatus of claim 9, wherein said controlling means comprises an optical link that controls said object.

12. The exposure apparatus of claim 9, wherein said receiving means comprises a linear head member for receiving said pattern image projected from said predetermined projecting member.

13. The exposure apparatus of claim 12, wherein said linear head member includes a plurality of light receiving elements, arranged along a moving direction of said object, for respectively receiving said pattern image, whereby pitches of said pattern image are received by said plurality of light receiving elements in a predetermined phase interval determined by the number of said plurality of light receiving elements.

14. The exposure apparatus of claim 13, wherein said number of said plurality of light receiving elements is four.

15. The exposure apparatus of claim 9, further comprising means for controlling said original image to move said original image by a predetermined amount and at a predetermined rate of speed.

16. The exposure apparatus of claim 15, wherein said controlling means comprises a linear head member for measuring the movement of said original image with respect to said projecting lens system.

17. The exposure apparatus according to claim 5, wherein said means for controlling said original image comprises a first linear scale, wherein said first linear scale moves in accordance with the movement of said original image.

18. The exposure apparatus according to claim 17, wherein said means for controlling said original image further comprises means for detecting movement of said first linear scale relative to said projecting lens system.

19. The exposure apparatus according to claim 18, wherein said means for detecting movement of said first linear scale comprises a first linear head.

20. The exposure apparatus according to claim 5, wherein said means for controlling said original image comprises second light receiving means for receiving said scale image by said first drive means and outputting a predetermined signal based upon the movement of said scale image.

21. The exposure apparatus according to claim 20, wherein said second light receiving means comprises a first linear head.

22. The exposure apparatus according to claim 1, further comprising open-loop means for controlling said first means for driving.

23. The exposure apparatus according to claim 1, further comprising means for detecting movement of said object to be exposed to light with respect to said projecting lens system.

24. The exposure apparatus according to claim 23, wherein said means for detecting movement of said object to be exposed to light comprises a second linear scale, wherein said second linear scale moves in accordance with the movement of said original image.

25. The exposure apparatus according to claim 24, wherein said means for detecting movement of said object to be exposed to light further comprises a second linear head.

26. The exposure apparatus according to claim 23, further comprising means for comparing movement detected by said means for detecting movement of said object to be exposed to light with said movement of said projecting scale image.

27. The exposure apparatus according to claim 15, wherein said means for controlling said original image comprises a first linear scale.

28. The exposure apparatus according to claim 27, wherein said means for controlling said original image further comprises means for detecting movement of said first linear scale.

29. The exposure apparatus according to claim 28, wherein said means for detecting movement of said first linear scale comprises a first linear head.

30. The exposure apparatus according to claim 15, wherein said means for controlling said original image comprises second light receiving means for receiving said pattern image by said first drive means and outputting a predetermined signal based upon the movement of said pattern image.

31. The exposure apparatus according to claim 30, wherein said second light receiving means comprises a first linear head.

32. The exposure apparatus according to claim 9, further comprising open-loop means for controlling said first means for driving with respect to said projecting lens system.

33. The exposure apparatus according to claim 9, further comprising means for detecting movement of said object to be exposed to light with respect to said projecting lens system.

34. The exposure apparatus according to claim 33, wherein said means for detecting movement of said object to be exposed to light comprises a second linear scale, wherein said second linear scale moves in accordance with the movement of said original image.

35. The exposure apparatus according to claim 34, wherein said means for detecting movement of said object to be exposed to light further comprises a second linear head.

36. The exposure apparatus according to claim 33, further comprising means for comparing movement detected by said means for detecting movement of said object to be exposed to light with said movement of said projecting pattern image.

37. The exposure apparatus according to claim 1, wherein said scale image is formed through said projecting lens system.

* * * * *

UNITED STATES PATENT AND TRADEMARK OFFICE
CERTIFICATE OF CORRECTION

PATENT NO. : 5,168,306
DATED : December 1, 1992
INVENTOR(S) : A. MORIMOTO et al.

It is certified that error appears in the above-indentified patent and that said Letters Patent is hereby corrected as shown below:

Column 6, lines 34-35, delete "scale member".

Signed and Sealed this

Twenty-third Day of August, 1994

Attest:

BRUCE LEHMAN

Attesting Officer

Commissioner of Patents and Trademarks